US005907252A

United States Patent [19]

Hayakawa et al.

[11] Patent Number: 5,907,252

[45] Date of Patent: May 25, 1999

[54] DRIVING CIRCUIT FOR ELECTROMAGNETIC RELAY

[75] Inventors: Junji Hayakawa, Okazaki; Yoshichika Abe, Anjo; Fukuo Ishikawa, Kariya; Shigekazu Sugimoto, Takahama, all of Japan

[73] Assignees: Denso Corporation, Kariya; Anden Co., Ltd., Anjo, both of Japan

[21] Appl. No.: 08/935,728

[22] Filed: Sep. 23, 1997

[30] Foreign Application Priority Data

| | | | |
|---|---|---|---|
| Sep. 24, 1996 | [JP] | Japan | 8-251837 |
| Sep. 4, 1997 | [JP] | Japan | 9-239985 |

[51] Int. Cl.[6] .......... H03K 3/53

[52] U.S. Cl. .......... 327/110; 327/385

[58] Field of Search .......... 327/110, 304, 327/384, 385

[56] References Cited

U.S. PATENT DOCUMENTS

| | | | |
|---|---|---|---|
| 3,654,489 | 4/1972 | Knapton | 327/445 |
| 3,798,608 | 3/1974 | Huebner | 375/258 |
| 3,944,912 | 3/1976 | Angel et al. | 324/233 |
| 4,539,466 | 9/1985 | Yamamato | 219/203 |
| 4,928,779 | 5/1990 | Yamada | 180/178 |
| 5,406,440 | 4/1995 | Wieloch | 361/154 |
| 5,546,268 | 8/1996 | Hurley et al. | 361/154 |

FOREIGN PATENT DOCUMENTS

| | | |
|---|---|---|
| 56-121232 | 9/1981 | Japan . |
| 57-13700 | 3/1982 | Japan . |
| 60-32514 | 2/1985 | Japan . |
| 61-296631 | 12/1986 | Japan . |
| 62-88338 | 6/1987 | Japan . |
| 2-100223 | 4/1990 | Japan . |
| 8-279414 | 10/1996 | Japan . |

*Primary Examiner*—Timothy P. Callahan
*Assistant Examiner*—An Luu
*Attorney, Agent, or Firm*—Pillsbury, Madison & Sutro

[57] ABSTRACT

A driving circuit for the electromagnetic relay provides a coil of the electromagnetic relay with stepped voltage having a first voltage which is slightly larger than a minimum operating voltage which caused the coil to generate magnetic field capable of closing contacts of the electromagnetic relay and a second voltage higher than the first voltage, in response to a triggering signal to trigger the electromagnetic relay. According to this structure, because the first voltage lower than the second voltage is applied to the coil firstly, the contacts are closed by attracting force of the coil risen gently. As a result, the bouncing of the moving contact can be prevented. In addition, the response time required for the closing of the contacts can be prevented to become long.

18 Claims, 3 Drawing Sheets

FIG. 1
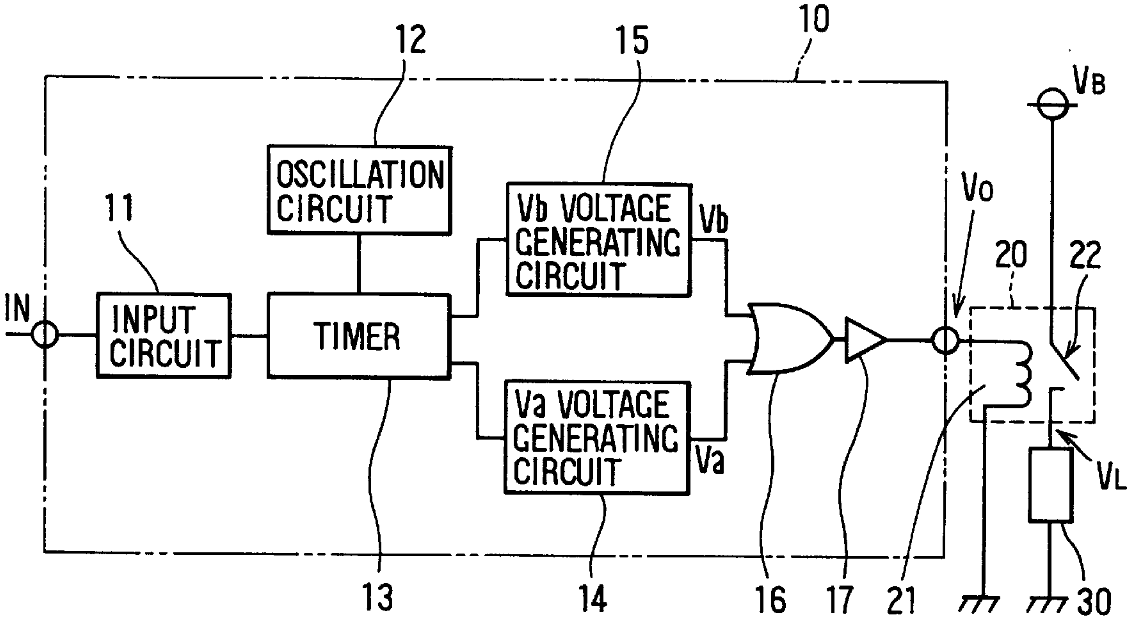
FIG. 2A
FIG. 2B
FIG. 2C
FIG. 2D
FIG. 2E
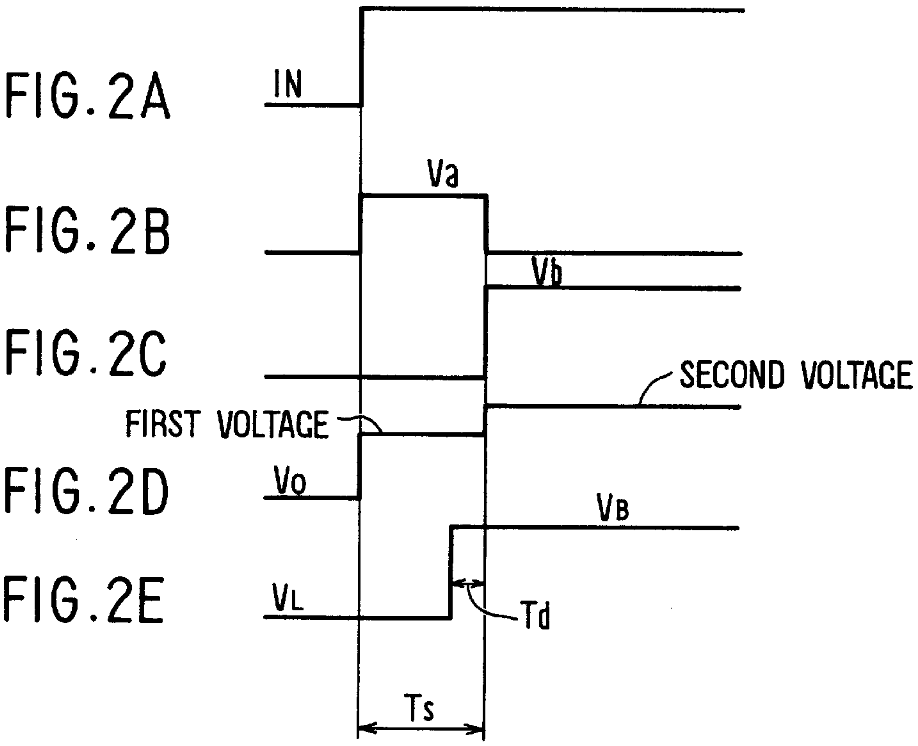

DRIVING CIRCUIT FOR ELECTROMAGNETIC RELAY

CROSS REFERENCE TO RELATED APPLICATION

This application is based upon and claims the benefit of priority of the prior Japanese Patent Application No. H.8-251837 filed on Sep. 24, 1996, the contents of which are incorporated herein by reference.

BACKGROUND OF THE INVENTION

1. Field of the Invention

The present invention relates to a driving circuit for driving an electromagnetic relay having a coil and moving and fixed contacts.

2. Related Art

The main cause of abrasion of contacts in an electromagnetic relay is the bouncing of a moving contact (chattering between a moving contact and a fixed contact) occurring when the contacts are closed. When the contacts are closed, if the strength of magnetic field to attract the moving contact is controlled to gently rise so that the speed of the moving contact approaching the fixed contact becomes slow, the bouncing of the moving contact can be suppressed.

Conventionally, there are techniques to suppress the bouncing of the moving contact. According to one example of these techniques, the rising of magnetic field is caused to be slow as the result that the rising of coil current is made gentle due to large inductance of the coil. In another example a time constant circuit is provided with a driving circuit for an electromagnetic relay, and the rising of magnetic field is caused to be slow as the result that the rising of voltage applied to the coil is made gentle. The latter technique is disclosed in, for example, Examined Utility Model Publication No. S. 57-13700.

In the latter technique described above, the more gently the voltage applied to the coil is increased, the more effectively the bouncing of the moving contact can be reduced. It takes long time, on the other hand, for the coil-applied voltage to reach a starting voltage at which the moving contact starts to move. As a result, there arises a problem such that a response time for switching of the relay becomes long. In addition, because the coil-applied voltage at the time of the contacts being closed is apt to vary, there is another problem such that the bouncing of the moving contact can not be stably reduced.

SUMMARY OF THE INVENTION

In view of the foregoing problems, the present invention has been made to provide a driving circuit for an electromagnetic relay which can stably suppress the bouncing of a moving contact while the response time for the switching of the electromagnetic relay is not made long.

To achieve this object, the driving circuit for the electromagnetic relay provides a coil of the electromagnetic relay with stepped voltage having a first voltage which is slightly larger than a minimum operating voltage which causes the coil to generate magnetic field capable of closing contacts of the electromagnetic relay and a second voltage higher than the first voltage, in response to a triggering signal to trigger the electromagnetic relay.

According to this structure, because the first voltage lower than the second voltage is applied to the coil firstly, the contacts are closed by attracting force of the coil risen gently. As a result, the bouncing of the moving contact can be stably reduced. In addition, because the first voltage is slightly larger than the minimum operating voltage capable of closing contacts, the response time required for the closing of the contacts can be prevented to become long.

Preferably, the voltage applied to the coil is switched from the first voltage to the second voltage when a predetermined time has elapsed after the closing of the contacts. As a result, the bouncing of the moving contact can be more reliably suppressed and operating sounds of the relay can be made small. The advantages of the switching of the coil-applied voltage in this way will be described comparing with a case in which the switching from the first voltage to the second voltage is performed in synchronism with the closing of the contacts. The electromagnetic relay assumes a stable closed state when a plate spring supporting the moving contact is completely attracted to the coil by electromagnetic force of the coil so that the plate spring makes contact with the coil after the closing of the contacts. Therefore, if the switching from the first voltage to the second voltage is performed at the same time that the contacts are closed, strong magnetic field due to high coil-applied voltage (second voltage) is applied to the plate spring. As a result, the plate spring vigorously collides against the coil, whereby large operating sounds occur. On the other hand, if the coil-applied voltage is switched from the first voltage to the second voltage when the predetermined time has elapsed after the closing of the contacts, the coil attracts the plate spring with weak magnetic field due to the first voltage even after the contacts are closed. When the predetermined time has elapsed, the plate spring is further attracted by strong magnetic field due to the second voltage and makes contact with the coil. Therefore, the distance that the plate spring moves when the plate spring is attracted to the coil by strong electromagnetic field due to the high second voltage is made short, whereby the operation sounds of the electromagnetic relay become small. It is to be noted that the bouncing of the moving contact can not be suppressed when the switching from the first voltage to the second voltage is performed before the contacts are closed as well.

It is also preferable that the first voltage is established using a lower potential at a lower potential terminal of the coil as a reference potential. As a result, the first voltage can be set to a desired value without the influence of variation of power supply voltage supplied to a higher potential terminal of the coil, whereby the closing operation of the electromagnetic relay can be reliably performed with the stabilized first voltage.

BRIEF DESCRIPTION OF THE DRAWINGS

Other features and advantages of the present invention will be appreciated, as well as methods of operation and the function of the related parts, from a study of the following detailed description, the appended claims, and the drawings, all of which form a part of this application. In the drawings:

FIG. 1 is a circuit diagram of a driving circuit for an electromagnetic relay according to a first embodiment of the present invention;

FIGS. 2A to 2E are timing charts illustrating waveforms at several parts of the driving circuit in FIG. 1;

DETAILED DESCRIPTION OF THE INVENTION

Figure 3A:
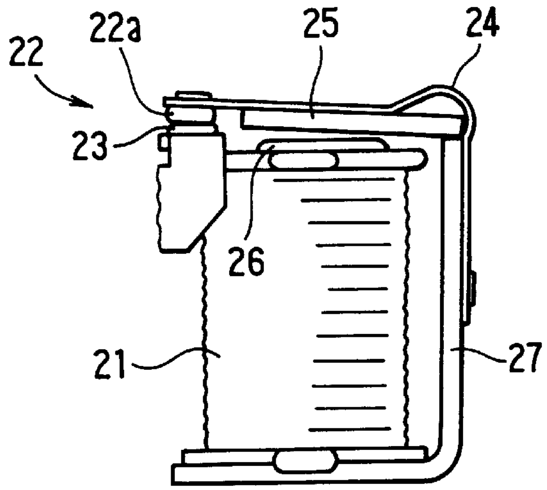
FIGS. 3A and 3B are plan views illustrating a detailed structure of the electromagnetic relay.

The embodiment of the present invention will be described with reference to the drawings.

Referring to FIG. 1, there is shown an electromagnetic relay and a driving circuit therefor. The driving circuit 10 is composed of an input circuit 11, an oscillation circuit 12, a timer circuit 13, a Va voltage generating circuit 14, a Vb voltage generating circuit 15, an OR gate 16 and an output circuit 17. The electromagnetic relay 20 is composed of a coil 21 and contacts 22. When the contacts 22 are closed, the electromagnetic relay 20 supplies driving voltage (battery voltage) $V_B$ to a load 30 such as a lamp.

The operation of the driving circuit structured as described above will be explained referring to the timing chart shown in FIG. 2.

When an input signal IN to the input circuit 11 turns into a high-level signal which is a triggering signal for triggering the electromagnetic relay 20 (FIG. 2A), the timer circuit 13 causes the Va voltage generating circuit 14 to generate a voltage Va (FIG. 2B). Due to this voltage Va, an output voltage $V_0$ of the output circuit 17 becomes a first voltage which can actuate the contacts 22 (FIG. 2D). When the first voltage is applied to the coil 21, a moving contact of the contacts 22 is attracted toward a fixed contact by magnetic field of the coil 21. As a result, the contacts 22 are closed without occurrence of the moving contact bouncing, and driving voltage is supplied to the load 30 (FIG. 2E).

Further, the timer circuit 13 counts time period based on clock signals from the oscillation circuit 12. After the first voltage is applied, if the timer circuit 13 has counted a predetermined time period $T_s$, the timer circuit 13 causes the Vb voltage generating circuit 15 to generate a voltage Vb higher than the voltage Va (FIG. 2C). Due to this voltage Vb, the output voltage $V_0$ of the output circuit 17 becomes the second voltage which causes the coil 21 to generate strong magnetic field by which the moving contact of the contacts 22 is completely attracted to the fixed contact thereof (FIG. 2D).

Therefore, stepped voltage having a step-wise waveform shown in FIG. 2D is applied to the coil 21 with use of the first and second voltage. In this case, because the moving contact of the contacts 22 is attracted by the magnetic field of the coil 21 generated when the first voltage is applied thereto, the lengthening of the response time can be kept to a minimum. In addition, when the contacts 22 are being closed, the magnetic field due to the first voltage which is a lower voltage acts on the moving contact. Therefore, the magnetic field due to the first voltage rises gently, and the bouncing of the moving contact can be reduced when the contacts 22 are closed. As a result, the wear of the electromagnetic relay can be made longer.

It is preferable that the first voltage is slightly higher than a minimum actuating voltage which can actuate the electromagnetic relay 20 (for example 6 to 8 (v) for a rated voltage 12 (v)), and the time period $T_S$ for the first voltage to be generated is 3 to 20 (ms) which can cover a period required for an initial closing operation of the contacts 22 of the electromagnetic relay. That is, it is preferable that the time period $T_S$ for the first voltage to be generated is established to be longer than a time period from a time when the first voltage starts to be applied to the coil 21 to a time when the contacts 22 are closed, as shown in FIGS. 2B and 2E.

The advantages of the present embodiment will be described referring to the FIGS. 3A and 3B which illustrate the detailed structure of the electromagnetic relay 20.

Figure 3B:
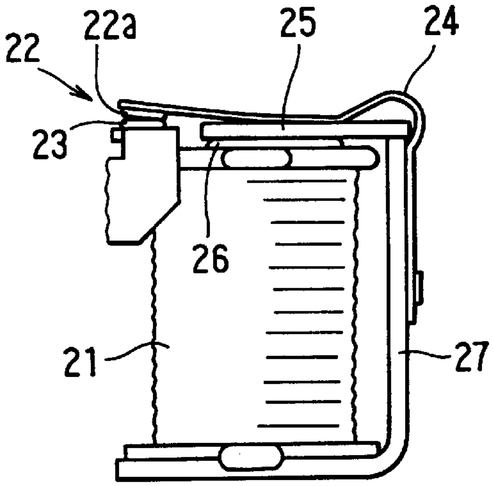

In FIGS. 3A and 3B, the electromagnetic relay is constituted by a yoke 27 supporting the coil 21, a plate spring 24 one end of which is fixed to a top face of the yoke 27 and which is bent L-shape, a moving contact 22*a* provided at the tip portion of the plate spring 24, a fixed contact 23 provided on a side end of the coil 21 so as to face the moving contact 22*a*, an iron plate 25 mounted on an intermediate portion of the plate spring, and a core 26 disposed in the coil 21 one end portion of which faces the iron plate 25. It is to be noted that only the constitution necessary to explain the advantages of the present embodiment is illustrated in FIGS. 3A and 3B.

FIG. 3A shows a state of the electromagnetic relay when the contacts 22 are closed by magnetic field due to the first voltage, and FIG. 3B shows a state thereof when the voltage applied to the coil 21 is switched from the first voltage to the second voltage and the plate spring 24 (iron plate 25) are completely attracted to the coil 21 (core 26). If the coil-applied voltage is switched from the first voltage to the second voltage immediately after the contacts 22 are closed as shown in FIG. 3A, because there is a relatively long distance between the iron plate 25 and the core 26, the plate spring 24 and the iron plate 25 are accelerated by strong magnetic field due to the second voltage. As a result, the iron plate 25 vigorously collides with the core 26 so that loud operating sounds are made. For this reason, in the present embodiment, the coil-applied voltage is switched from the first voltage to the second voltage after the predetermined time period $T_d$ has elapsed from the closing of the contacts 22. As a result, the plate spring 24 and the iron plate 25 are attracted to the coil 21 (core 26) by weak magnetic field due to the first voltage during a time period $T_d$ from the closing of the contacts 22 to the switching from the first voltage to the second voltage (FIG. 2E). Then, the iron plate 25 is further attracted to the core 26 to make contact with each other by strong magnetic field due to the second voltage after the distance between the iron plate 25 and the core 26 is made short to some extent. Therefore, the operating sounds generating when the iron plate 25 collides with the core 26 can be made smaller. It is to be noted that the time period $T_d$ from the closing of the contacts 22 to the switching to the second voltage is preferably set to a few milliseconds.

The present inventors investigated the timing for the coil-applied voltage to be switched from the first voltage to the second voltage. As a result, it has been found that the number of occurrence of the bouncing in the above-described embodiment is lower than that in a case where the timing for the coil-applied voltage to be switched to the second voltage is set to be prior to closing of the contacts 22.

Figure 4:
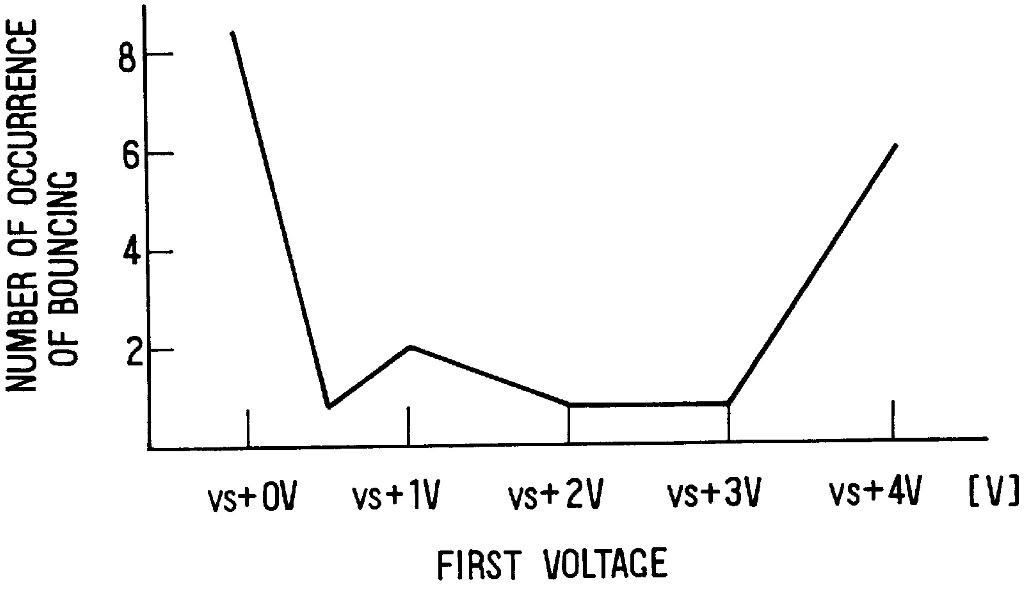
FIG. 4 is a graph illustrating a relationship between magnitude of the first voltage and rate of occurrence of bouncing.

Further, a relationship between the first voltage to initially close the contacts 22 and the average number of occurrence of the bouncing was investigated, and the results shown in FIG. 4 were obtained. In FIG. 4, an abscissa axis represents magnitude of the first voltage and an ordinates axis represents the average number of occurrence of the bouncing. It is to be noted that VS denotes a minimum actuating voltage. In detail, the minimum actuating voltage VS is a minimum voltage to cause the coil 21 to generate magnetic field which enables the contacts 22 to close from a state in which no voltage is applied to the coil 21 and the contacts 22 are open. For example, the minimum actuating voltage is about 5 (V) in a case of a rated voltage 12 (V). Further, ten times of measurements are taken at each of coil-applied voltages. The number of occurrence of the bouncing is detected based on a state of oscillation of voltage applied to the load 30 when the contacts 22 are closed. As understood from FIG. 4, when the first voltage is set to be larger by 0.5 to 3 (V) than the minimum actuating voltage VS, the bouncing can be effectively suppressed. In other words, the contacts 22 fall in a stable state after the moving contact 22*a* bounces only two times or less when the first voltage is in a range of VS+0.5 to VS+3 (V).

Figure 5:
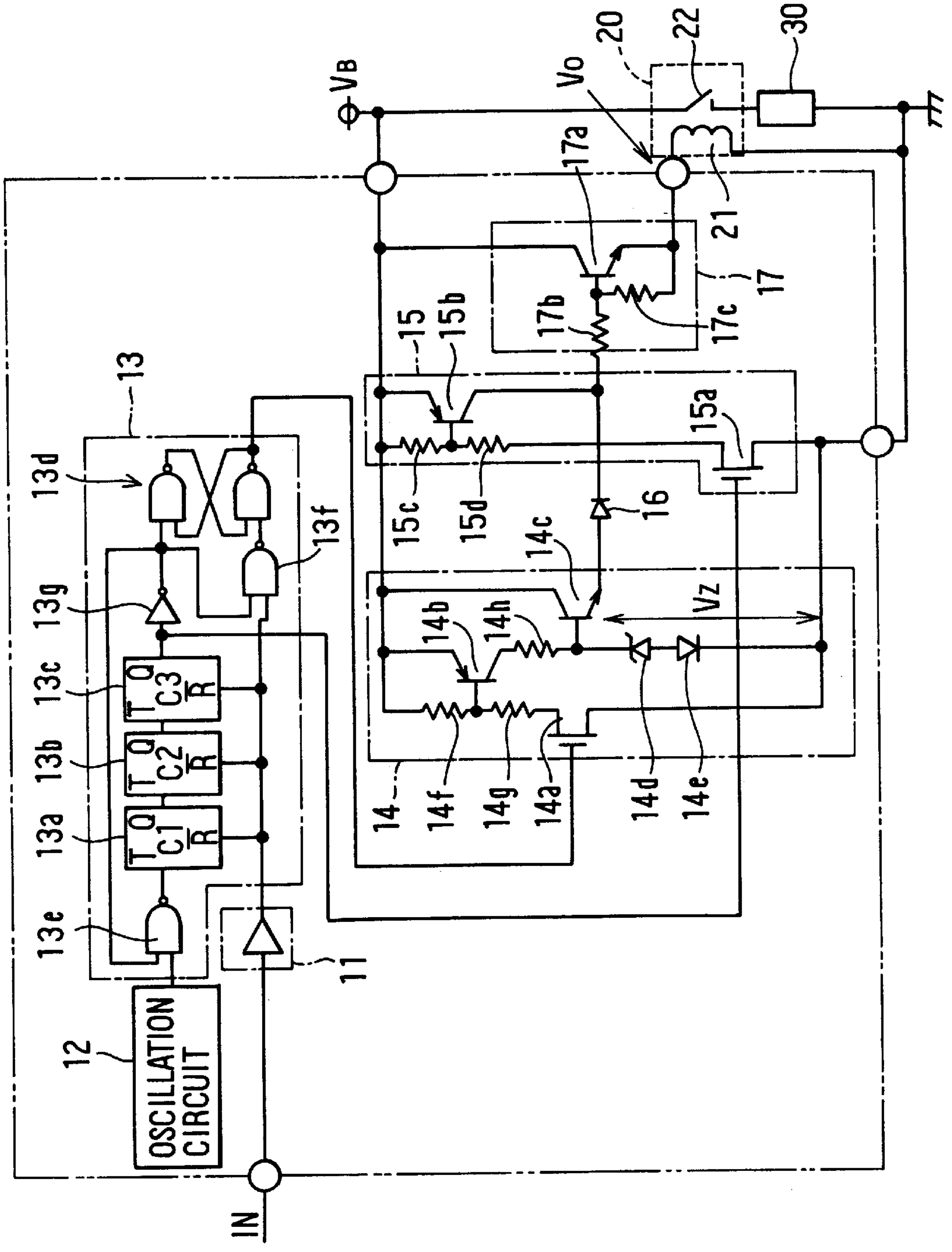
FIG. 5 is a circuit diagram illustrating a detailed circuit structure of the driving circuit shown in FIG. 1.

Next, the detailed circuit structure of the driving circuit shown in FIG. 1 will be described with reference to FIG. 5. The timer circuit 13 is composed of counters 13*a* to 13*c*, a flip-flop 13*d*, NAND gates 13*e* and 13*f*, and a NOT gate 13*g*. The Va voltage generating circuit 14 is composed of transistors 14*a* to 14*c*, a Zener diode 14*d*, a diode 14*e*, and resistors 14*f* to 14*h*. The Vb voltage generating circuit 15 is composed of transistors 15*a* to 15*b*, and resistors 15*c* and 15*d*. The OR gate 16 is constituted by a diode, and the output circuit 17 includes a transistor 17*a* and resistors 17*b* and 17*c*. It is to be noted that the diode 16 is provided to separate the voltage Vb which is generated by the Vb voltage generating circuit 15 from the voltage Va which is an output voltage of the Va voltage generating circuit 14.

The operation of the above-described circuit will be described.

When a level of an input signal IN to the input circuit 11 is low, the counters 13*a* to 13*c* of the timer circuit 13 are being reset. The counter 13*c* sends out a low level signal. In the meantime, since the output signal of the NAND circuit 13*f* is a high level signal, the output of the flip-flop 13*d* is made low level. As a result, in the Va voltage generating circuit 14, both of the transistors 14*a* and 14*b* are turned off, and the output voltage of the transistor 14*c* is set to a low level. Also, in the Vb voltage generating circuit 15, because the transistor 15*a* is being turned off, the output voltage of the Vb voltage generating circuit 15 is a low level voltage. For these reasons, voltage to drive the coil 21 of the electromagnetic relay 20 is not provided from the output circuit 17.

When the input signal IN to the input circuit 11 becomes a triggering signal which is a high level signal, the output of the NAND circuit 13*f* turns to a low level signal and so the flip-flop 13*d* is set so that the flip-flop 13*d* sends out a high level signal. As a result, in the Va voltage generating circuit 14, the transistors 14*a* and 14*b* are both turned on, and the terminal voltage across the Zener diode 14*d* becomes a voltage $V_Z$. Consequently, the emitter-follower transistor 14*c* outputs the voltage Va, and the first voltage having a constant level ($\neq V_Z - 3$ Vf, where Vf corresponds to a voltage drop of a diode) is applied to the coil 21 via the diode 16 and the output circuit 17.

In this way, the Zener diode 14*d* and the diode 14*e* are connected to a lower potential terminal of the coil 21 (in this embodiment, a ground terminal) and generate the voltage $V_Z$. As a result, the voltage Va which is the first voltage is established using a potential at the lower potential terminal as a reference potential. Therefore, the driving circuit can stably provide a desired voltage Va to the coil 21 even when the battery voltage $V_B$ fluctuates. It is to be noted that the cathodes of the Zener diode 14*d* and the diode 14*e* are connected to each other so that a temperature characteristic of the Zener diode 14*d* is cancelled by that of the diode 14*e*. In more detail, the Zener diode 14*d* has a positive temperature characteristic while the diode 14*e* has a negative temperature characteristic. Further, the positions of the Zener diode 14*d* and the diode 14*e* can be reversed. In this case, the anodes of the Zener diode 14*d* and the diode 14*e* are electrically connected to each other. Further, the circuit to generate the voltage $V_z$ may include elements such as a resistor and the like other than the Zener diode 14*d* and the diode 14*e*.

The counters 13*a* to 13*c* of the timer circuit 13 perform a counting operation in response to the clock signals from the oscillation circuit 12. When the time period $T_S$ has elapsed and the output of the counter 13*c* turns to a high level signal, the output of the NOT gate 13*g* turns to a low level signal. As a result, because a low level signal is fed to the NAND gate 13*e* from the NOT gate 13*g*, the counting operation of the counters 13*a* to 13*c* is suspended. Also, because the flip-flop is reset by the output of the NOT gate 13*g*, the output of the flip-flop 13*d* turns to a low level signal. In response to this, the voltage generating operation in the Va voltage generating circuit 14 is also suspended. In the meantime, because the output of the counter 13*c* is the high level signal, the transistors 15*a* and 15*b* in the Vb voltage generating circuit 15 are both turned on, and the transistor 15*b* outputs the voltage Vb to the output circuit 17. Due to this voltage Vb, the second voltage is applied to the coil 21 via the output circuit 17.

If the electromagnetic relay is used for turn signal lamps of a vehicle, as the oscillation circuit 12 and the timer circuit 13 in the driving circuit, existing timer circuit and oscillation circuit for the blinking of the turn signal lamps can be utilized. Further, while the second voltage is generated, because constant voltage control does not need to be performed with respect to the emitter-follower transistor 14*c* it is sufficient to provide the transistor 15*b* of the Vb voltage generating circuit 15 with ON voltage much lower than the voltage $V_Z$ for generating the first voltage. Due to this, heat loss of the emitter-follower transistor 14*c* can be limited to a low level, and it is not necessary to use a transistor having a large rated voltage performance. Therefore, the above-described circuit structure can be realized without increase of elements and costs.

Next, when the driving circuit according to the present embodiment is used as a driving circuit for an electromagnetic relay which drives the turn signal lamps of the vehicle, the results obtained with respect to the amount of abrasion of contacts are shown in Table 1. It is to be noted that the turn signal lamps are continuously blinked by the electromagnetic relay, and the material of the contacts is combination of Pd system and Ag system normally used for a lamp load. Further, in a case "A", a volume reduction amount (the amount of abrasion) of the contacts per 1000 hr is shown when the electromagnetic relay is driven by conventional rectangular-wave voltage, and in a case "B", the volume reduction amount of the contacts per 1000 hr is shown when the electromagnetic relay is driven by stepped voltage generated by the driving circuit as described above.

TABLE 1

| A (rectangular-wave voltage) | B (stepped voltage) |
|---|---|
| 0.48 $mm^3$/1000 hr | 0.16 $mm^3$/1000 hr |

From the Table 1, when the electromagnetic relay is driven by the stepped voltage (in case "B"), the abrasion amount of the contacts is limited to one-third of the abrasion amount of the contacts in the case "A". Therefore, according to the present embodiment, the lifetime of the electromagnetic relay can be increased by three times.

As described above, if the load 30 is a lamp or the like, arc discharge is apt to occur due to rush current produced when current starts to be provided to the load 30 via the electromagnetic relay 20, and as the result, the contacts 22 of the electromagnetic relay is likely to wear away. However, according to the present embodiment, because the bouncing of the moving contact 22*a* occurring when the contacts 22 of the electromagnetic relay 20 are closed can be reduced, arc discharge occurring in the contacts 22 can be suppressed. As a result, the abrasion of the contacts 22 can be reduced, whereby the wear of the contacts 22 can be remarkably improved. Further, radio noises occurring when the moving contact bounces and the operating sound of the electromagnetic relay 20 can be also reduced.

What is claimed is:

1. A driving circuit for an electromagnetic relay having a coil generating magnetic field and contacts including moving and fixed contacts, said contacts being closed due to magnetic field generated by said coil, said driving circuit comprising:

a first voltage generating circuit which generates a first voltage to be applied to said coil so that said moving contact makes contact with said fixed contact, in response to a triggering signal to trigger said electromagnetic relay; and a second voltage generating circuit which generates a second voltage higher than said first voltage, said second voltage being applied to said coil after a predetermined time period has elapsed from closing of said moving contact.

2. A driving circuit for an electromagnetic relay according to claim 1, wherein said first voltage is larger by 0.5 to 3 volts than a minimum actuating voltage which cause said coil to generate magnetic force capable of closing said moving contact.

3. A driving circuit for an electromagnetic relay according to claim 1, wherein said first voltage is established using a potential at a lower potential terminal of said coil as a reference potential.

4. A driving circuit for an electromagnetic relay according to claim 1, wherein said electromagnetic relay supplies electrical power to a lamp as a load.

5. A driving circuit for an electromagnetic relay having a coil generating magnetic field and contacts including moving and fixed contacts, said contacts being closed due to magnetic field generated by said coil, said driving circuit comprising:

a first voltage generating circuit which generates a first voltage higher by 0.5 to 3 volts than a minimum actuating voltage which cause said coil to generate magnetic force capable of closing said moving contact and applies said first voltage to said coil, in response to a triggering signal to trigger said electromagnetic relay; and a second voltage generating circuit which generates a second voltage higher than said first voltage, and applies said second voltage to said coil in place of said first voltage, wherein said coil is applied with a stepped voltage including said first voltage and said second voltage.

6. A driving circuit for an electromagnetic relay according to claim 5, wherein said first voltage is established using a potential at a lower potential terminal of said coil as a reference potential.

7. A driving circuit for an electromagnetic relay according to claim 5, wherein said electromagnetic relay supplies electrical power to a lamp as a load.

8. A driving circuit for an electromagnetic relay having a coil generating magnetic field and contacts including moving and fixed contacts, said contacts being closed due to magnetic field generated by said coil, said driving circuit comprising:

a first voltage generating circuit which generates a first voltage;

a second voltage generating circuit which generates a second voltage higher than said first voltage; and a voltage control circuit which applies said first voltage generated by said first voltage generating circuit to said coil so that said moving contact makes contact with said fixed contact, in response to a triggering signal to trigger said electromagnetic relay and applies said second voltage generated by said second voltage generating circuit after a predetermined time period has elapsed from application of said first voltage to said coil, wherein said predetermined time period is set to be longer than a time period from said application of said first voltage to said coil to closing of said moving contact.

9. A driving circuit for an electromagnetic relay according to claim 8, wherein said first voltage is larger by 0.5 to 3 volts than a minimum actuating voltage which cause said coil to generate magnetic force capable of closing said moving contact.

10. A driving circuit for an electromagnetic relay according to claim 8, wherein said voltage control circuit includes a timer circuit that measures a time period after said first voltage is applied to said coil and switches coil-applied voltage from said first voltage to said second voltage when measured time period has reached said predetermined time period.

11. A driving circuit for an electromagnetic relay according to claim 8, wherein said first voltage is established using a potential at a lower potential terminal of said coil as a reference potential.

12. A driving circuit for an electromagnetic relay according to claim 11, wherein said first voltage generating circuit includes a transistor of which a base terminal is supplied with constant voltage from a voltage supplying circuit including a PN junction element.

13. A driving circuit for an electromagnetic relay according to claim 12, wherein said voltage supplying circuit is composed of a Zener diode and a diode which are electrically connected at their same pole to each other.

14. A driving circuit for an electromagnetic relay according to claim 8, wherein said electromagnetic relay supplies electrical power to a lamp as a load.

15. A driving circuit for an electromagnetic relay having a coil generating magnetic field and contacts including moving and fixed contacts, said contacts being closed due to magnetic field generated by said coil, said driving circuit comprising:

a first voltage generating circuit connected to a lower potential terminal of said coil, for generating a first voltage which is established using a potential at said lower potential terminal of said coil as a reference potential and applies said first voltage to said coil, in response to a triggering signal to trigger said electromagnetic relay, said first voltage generating circuit; and a second voltage generating circuit which generates a second voltage higher than said first voltage, and applies said second voltage to said coil in place of said first voltage, wherein said coil is applied with a stepped voltage including said first voltage and said second voltage.

16. A driving circuit for an electromagnetic relay according to claim 15, wherein said first voltage generating circuit includes a transistor of which a base terminal is supplied with constant voltage from a voltage supplying circuit including a PN junction element.

17. A driving circuit for an electromagnetic relay according to claim 16, wherein said voltage supplying circuit is composed of a Zener diode and a diode which are electrically connected at their same pole to each other.

18. A driving circuit for an electromagnetic relay according to claim 15, wherein said electromagnetic relay supplies electrical power to a lamp as a load.

* * * * *